United States Patent [19]

Wood et al.

[11] 4,318,093
[45] Mar. 2, 1982

[54] LOGIC CIRCUIT MONITOR

[75] Inventors: Robert J. Wood, Ballston Spa; John F. Mitchell, Latham, both of N.Y.

[73] Assignee: General Electric Company, Schenectady, N.Y.

[21] Appl. No.: 124,325

[22] Filed: Feb. 25, 1980

[51] Int. Cl.³ ............................................. G08B 21/00
[52] U.S. Cl. ................................. 340/644; 307/219; 340/508; 340/639; 340/653
[58] Field of Search ............... 340/644, 653, 639, 508; 307/441, 219; 361/170, 189; 324/415

[56] References Cited

U.S. PATENT DOCUMENTS

| | | | |
|---|---|---|---|
| 3,373,367 | 3/1968 | Clarke | 340/653 |
| 3,748,540 | 7/1973 | Eggenberger et al. | |
| 3,829,232 | 8/1974 | Fieglein | 415/1 |

Primary Examiner—John W. Caldwell, Sr.
Assistant Examiner—Daniel Myer
Attorney, Agent, or Firm—Ormand R. Austin; John F. Ahern

[57] ABSTRACT

A monitor for logic circuits detects loss of redundancy within the monitored circuit and designates that portion thereof which is out of service. Loss of redundancy is detected by sensing the passage of normal load current, or a portion thereof, through shunt current paths; the occurrence of such current flow coupled with the direction of flow uniquely determining the portion of the logic circuit which is out of service. In a preferred form of the invention, a low ohmic valued resistor is connected in each shunt current path. Upon loss of redundancy, a voltage signal generated across at least one such resistor, is applied to one or more parallel connected amplifiers responsive to the signal to activate corresponding switching circuits and audio/visual indicators.

15 Claims, 3 Drawing Figures

LOGIC CIRCUIT MONITOR

This invention relates generally to redundant logic protection control systems, and in particular to apparatus for continuously monitoring the integrity of redundancy built into such control systems.

BACKGROUND OF THE INVENTION

In critical control circuits it has become standard practice to require redundant response from sensing devices and associated components before a critical control action can be taken. This provides relative certainty that the control action is only in response to valid signals and is not a result of failure of the sensor itself or of some other associated component or device. For example, in the field of monitoring and controlling the rotational speed of a turbine rotor, it is necessary to take very positive action in the event the rotational speed reaches a critical overspeed limit. It is common practice, therefore, to provide at least three separate and independent channels by which rotational speed is monitored. For these three-channel monitoring and control systems, redundant logic switching networks have been provided which require that at least two out of the three channels must respond properly before control action can follow. Such logic control systems are described in U.S. Pat. No. 3,748,540 to Eggenberger et al, the disclosure of which is incorporated herein by reference thereto.

A problem with the aforementioned redundant logic control networks has been that a malfunction within any one of the separate sensor/control channels can destroy the supposed redundancy without being noticed. Under these conditions, a failure, false response, or even a test of any one of the remaining channels can lead to strong control action being taken on a nonvalid signal.

The above cited patent to Eggenberger et al seeks to alleviate this problem by providing a redundancy monitoring technique wherein the switch contacts within the redundant control network are provided with parallel connected voltage sensing devices which respond upon failure of certain of the redundant contacts and can therefore be used to notify operating personnel of an abnormal condition. Close inspection of the system reveals, however, that the technique is directed to use with actively open switch contacts, i.e, those switches which become closed upon sensing a limit condition. Furthermore, the voltage sensors actually used in practice have been meter relays; a device well known to those of ordinary skill in the art and known to require a relatively long time before they respond.

Accordingly, it is one object of the present invention to provide a monitor for redundant logic control networks which can be used to signal the loss of such redundancy in an actively closed (closed under normal operating conditions) redundant logic network, and which indicates with particularity that portion of the control network which is inoperable.

It is a further object of the invention to provide a monitor for redundant logic control networks wherein the monitor has improved response time and which is responsive to changes in current flow within the control network.

BRIEF DESCRIPTION OF THE DRAWINGS

While the specification concludes with claims particularly pointing out and distinctly claiming the subject matter regarded as the invention, the invention will be better understood from the following description taken in connection with the accompanying drawings in which:

SUMMARY OF THE INVENTION

Figure 1:
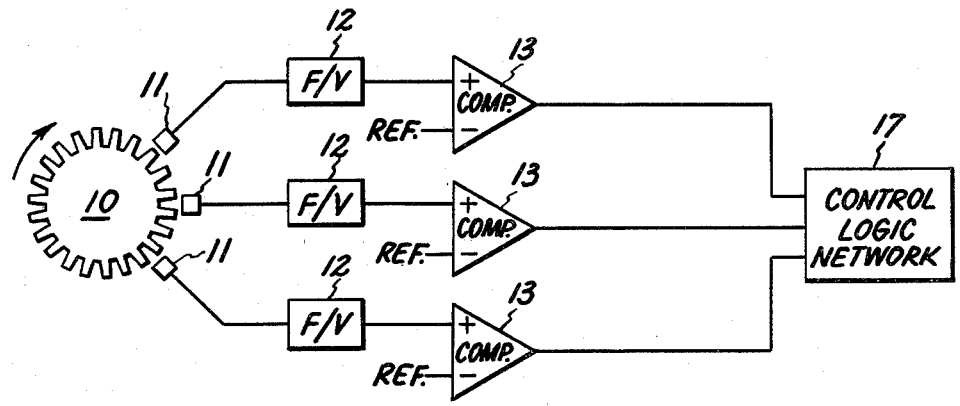
FIG. 1 is a schematic illustration of a typical three channel overspeed control system for a turbine and within which control system the present invention may be incorporated.

Briefly stated, the invention is practiced by providing means for sensing current in shunt current paths through which normal load current, or a portion thereof, is diverted in the event of loss of redundancy within the control network under otherwise normal operating conditions. The current sensing means provide signals to detector networks which respond by activating corresponding indicator devices. Each indicator uniquely designates a portion of the control network which is malfunctioning or which is under test. One detector network is provided for each channel of the control system. For example, in a three channel control system having two out of three redundancy, three detector newtworks and three indicators are required.

DETAILED DESCRIPTION OF THE INVENTION

The invention may advantageously be described within the context of a rotational overspeed monitoring and protection system for a steam turbine. For example, in FIG. 1 a toothed wheel or spur gear 10 is attached to the rotating shaft (not specifically shown) of a turbine rotor and is rotatable therewith at the same speed. For redundancy, two or more, here three, magnetic sensors 11 are coupled to the toothed wheel 10 to independently sense the speed of rotation. An output signal from each magnetic sensor 11 is fed to a corresponding frequency-to-voltage converter 12, the output of which is an electrical signal whose magnitude is proportional to the turbine speed. This output signal is then compared to a reference signal in a voltage comparator 13. The reference signal is preset to correspond to a speed at which corrective action must be taken, for example an overspeed condition of 113% of turbine operating speed. When the turbine speed reaches this preset speed, voltage comparators 13 will sense the overspeed and independently provide signals indicating that the overspeed limit has been exceeded. These signals, in turn, are applied as actuation signals to control logic network 17.

The control logic network 17 includes a group of switching devices activated by the overspeed limit signals and which are configured in a network so that at least two out of three overspeed limit signals must be received before control action can follow. Details of the control logic network are more fully described below. Again, within the context of turbine speed control as an example, an overspeed response by two of the three sensor channels will activate the control logic network 17 which in turn can be used to activate other control elements which reduce turbine speed.

Figure 2:
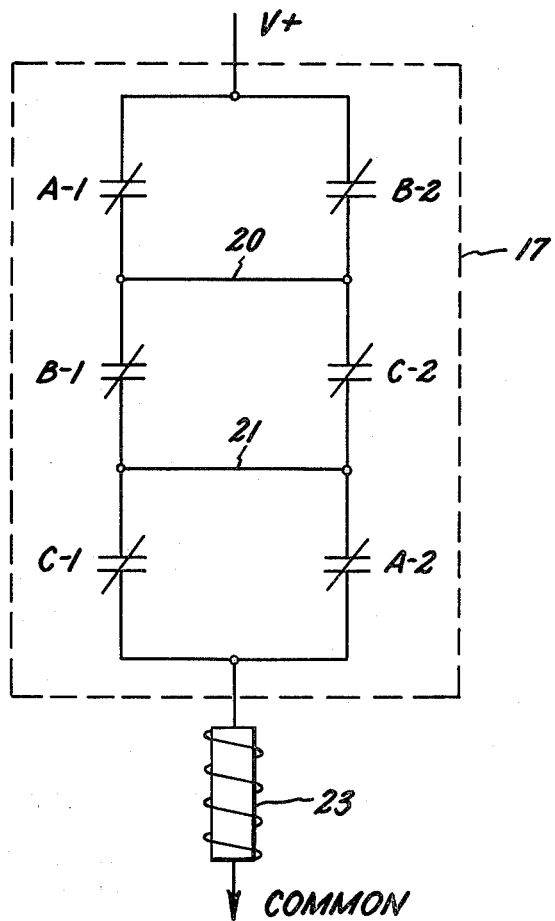
FIG. 2 is a schematic illustration of a two out of three logic switch network of the type having actively closed contact sets and wherein shunt paths are used to divert current in case a set of contacts is unclosed under normal operating conditons.

One example of the control logic network 17 of FIG. 1 is that illustrated in FIG. 2 in which three sets of actively closed switches or relay contacts are arranged in a commonly used two out of three redundant logic control network. Each set of contacts comprises two separate contacts and each set is separately associated with an actuator or sensor channel such as one of the three channels of overspeed sensing of FIG. 1. In FIG. 2, the three input actuating lines, as from comparators 13 of FIG. 1 are not shown. Although switch contacts are illustrated in FIG. 2, other switching means such as solid state switching elements may be used in the same configuration and to the same effect in combination with the present invention. The network of FIG. 2 includes actively closed contacts; the term "actively closed" referring to the fact that the contacts are closed in their normal state during operation. For example, for overspeed monitoring of a turbine, the contacts are closed so long as the speed limit is not exceeded. Thus they may be opened as a result of a manual test of one of the redundant speed sensor channels or due to some malfunction. An actively closed protection network is inherently more reliable than an actively open network. Correspondingly activated contacts in FIG. 2 include A-1 and A-2; B-1 and B-2; and C-1 and C-2. The contacts are arranged in series with a source of DC voltage V+ and a load switching relay coil 23 which is activated or deactivated depending on the status of the two out of three control network 17. Shunt paths 20 and 21 carry the activation current to coil 23, or at least a portion thereof, whenever any one set of the contacts is open and the remaining contact sets are closed. Analysis of the network 17 reveals that at least two of the three sets of contacts, A, B and C, must open to deactivate coil 23. It will be understood that deactivating coil 23 causes appropriate control action to be taken. Such action includes the rapid closing of steam valves to prevent admission of steam to a steam turbine following an overspeed tripout.

Figure 3:
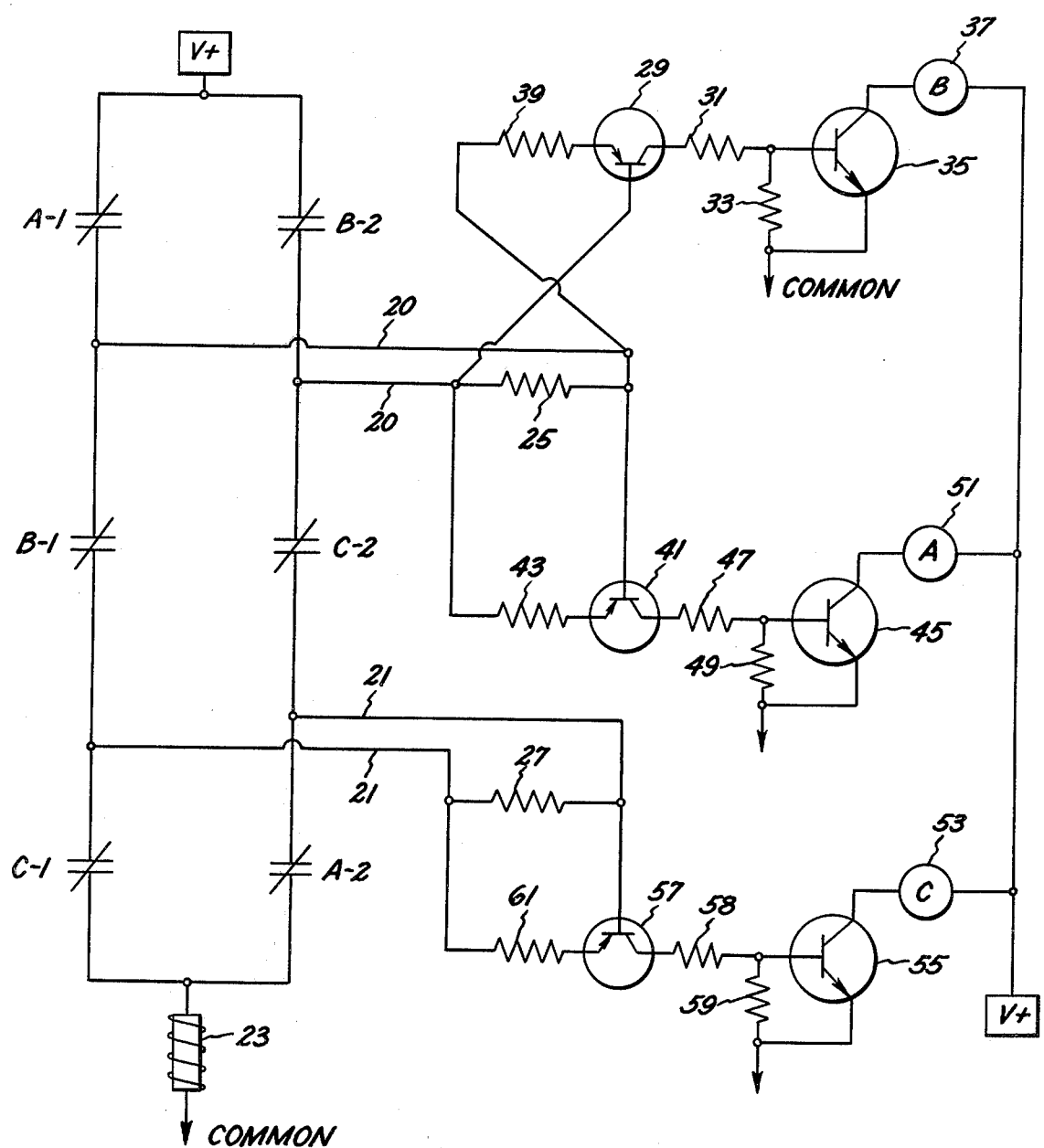
FIG. 3 is a schematic circuit diagram of a preferred embodiment of the present invention as applied to the two out of three logic switching network of FIG. 2.

In FIG. 3, illustrating a preferred embodiment of the invention, relay contacts A-1, A-2, B-1, B-2, C-1, and C-2 comprise a two out of three contact logic network with actively closed contacts to maintain a load current for activation of load switching relay 23. Relay coils or solenoids, for activating relay contacts A, B, and C are not specifically shown. Disposed within the shunt current paths 20 and 21 are shunt resistors 25 and 27, each of which is of relatively low resistance as compared to the resistance of load relay 23. Thus, with any one of the three sets of relay contacts A, B, or C open, as for example whenever there is a single channel malfunction or a manual test of a single channel, the total current flow for maintaining activation of load relay 23 remains substantially unchanged even though the load current, or a portion of it, passes through one of the shunt resistors, 25 or 27. For example, shunt resistors 25 and 27 may be on the order of one ohm each. However, the actual value of the shunt resistors 25 and 27 is dictated by the magnitude of the applied voltage V+ and the resistance of load relay 23.

Diversion of load current through either shunt resistor 25 or 27 gives rise to a voltage drop signal which, when taken with the polarity of that signal, uniquely determines which set of contacts is open. For example, if contacts B-1 and B-2 are open while contacts A-1, A-2, C-1, and C-2 remain closed, load current will be diverted through shunt resistor 25 in a direction that makes the base electrode of transistor 29 negative and the emitter electrode thereof positive. The result is that transistor 29 is brought into a conduction state and in turn, by way of coupling through a voltage divider comprising resistor 31 and 33, transistor switch 35 is also brought into conduction to activate indicator 37. Indicator 37 thru designates relay contact B-1 and B-2 as being opened. Proper biasing of transistor 29 is established by including resistor 39 in the emitter connection thereof.

Similarly, if relay contacts A-1 and A-2 are open while contacts B-1, B-2, C-1, and C-2 remain closed, a portion of the load current will pass through shunt resistor 25, but in an opposite direction than when the B sets of contacts are open. This gives rise to a voltage drop signal across shunt resistor 25 which is of such polarity that transistor 29 remains non-conducting, but which is of proper polarity to turn transistor switch 41 on. The base of transistor 41 is connected directly to shunt resistor 25; the emitter electrode is connected through resistor 43 to the other end of the shunt resistor 25. Bringing transistor 41 into conduction causes transistor 45 to be switched on. Coupling between transistors 41 and 45 is by virtue of a voltage divider formed of resistors 47 and 49. An indicator 51 is rendered active by the conduction of transistor 45 and thus designates that contact set A is open.

An indicator 53 for designating that the C set of contacts is open is similarly activated by a shunt current signal detector comprising transistors 55 and 57 and resistors 58, 59, and 61. Although a portion of the load current passes through shunt resistor 27 in those situations wherein the A set of contacts alone are open, the C indicator 53 will not be activated since the polarity of the voltage drop signal across shunt resistor 27 is such that transistor 57 remains in a nonconducting state. It will be apparent to those of ordinary skill in the art, however, that another embodiment of the invention includes that wherein the A indicator 51 and its detector comprising transistors 41 and 45, and resistors 43, 47, and 49 is connected to detect the flow of current through shunt resistor 27 rather than that through shunt resistor 25. The indicators 37, 51, and 53 may be visual indicating devices such as light emitting diodes or incandescent lamps, or they may be electronic or electromechanical devices to actuate other indicators or control apparatus.

Although a preferred embodiment of the invention has been shown and described, it is understood that various modifications may be made therein. For example, the shunt resistors used for sensing current in the shunt current paths may be replaced by other low resistance current sensing means. It is intended by the appended claims to claim all modifications and embodiments which fall within the true spirit and scope of the present invention.

What is claimed is:

1. In combination with a multiply redundant switching network providing protective control, and wherein such switching network includes at least one shunt current path to carry at least a portion of a switched load current in the event of a malfunction or test within said switching network, a monitor for indicating loss of redundancy within said switching network, comprising:

means for sensing shunt current flow to produce a signal indicative of such current flow, there being one sensing means for each shunt current path; and means responsive to said current signal to cause a particular indication of that portion of said switching network which is malfunctioning or under test, there being at least one such signal responsive means for each shunt current path.

2. The combination of claim 1 wherein each said means for sensing shunt current flow comprises a shunt resistor having relatively low ohmic value so that said switched load current remains substantially unchanged thereby.

3. The combination of claims 1 or 2 wherein said signal responsive means comprises a polarity sensitive detector producing an output signal in response to said current signal of one polarity; a switching means adapted to activate in response to the output signal of said detector; and an indicator responsive to activation of said switching means for designating that portion of said switching network which is malfunctioning or under test.

4. The combination of claim 3 wherein said detector comprises a transistor amplifier, said switching means comprises a transistor switch, and said indicator is a visual indicator.

5. In combination with a three channel redundant control circuit providing an actively closed two out of three redundant logic control network having first and second shunt current paths for diversion of a load current in the event of a loss of redundancy by said two out of three control network, a monitor for indicating such loss, comprising:

first current sensing means disposed within said first shunt current path to produce a first shunt signal indicative of curent flow in said first shunt current path, the polarity of said first shunt signal being indicative of shunt current flow direction;

second current sensing means disposed within second shunt current path to produce a second shunt signal indicative of current flow in said second shunt current path, the polarity of said second shunt signal being indicative of shunt current flow direction;

first detector means responsive to said first shunt signal whenever said first shunt signal is of positive polarity, said first detector means adapted to activate a first indicator uniquely designating a first one of said three channels to be out of service;

second detector means responsive to said first shunt signal whenever said first shunt signal is of negative polarity, said second detector means adapted to activate a second indicator uniquely designating a second one of said three channels to be out of service; and third detector means responsive to said second shunt signal whenever said second shunt signal is of positive polarity, said third detector means adapted to activate a third indicator uniquely designating a third one of said three channels to be out of service.

6. The combination of claim 5 wherein said second detector means is responsive to said second shunt signal whenever said second shunt signal is of negative polarity.

7. The combination of claim 5 wherein said first and second current sensing means are resistors of relatively low resistance so that shunt currents are susbantially equal in magnitude to normal load current.

8. The combination of claims 5 or 7 wherein said first, second, and third detector means each comprise an amplifier responsive to produce an output signal, and a switching means adapted to activate the associated indicator in response to said output signal.

9. The combination of claim 8 wherein said first, second, and third indicators are visual indicators.

10. In combination with a two out of three redundant logic switching network having first, second, and third sets of actively closed switching contacts and including first and second shunt paths for diversion of load current in the event of loss of redundancy due to an open set of contacts, a monitor for detecting such loss of redundancy, comprising:

a first shunt resistor disposed within said first shunt path to provide a first voltage drop signal indicative of current flow within said first shunt path, said voltage drop signal having a polarity indicative of current flow direction;

a second shunt resistor disposed within said second shunt path to provide a second voltage drop signal indicative of current flow within said second shunt path, said voltage drop signal having a polarity indicative of current flow direction;

a first detector network connected to receive said first voltage drop signal and adapted to activate a first indicator in response to said first signal when said first signal is of positive polarity, said first indicator thereby producing an indication that said first set of contacts is open;

a second detector network connected to receive said first voltage drop signal and adapted to activate a second indicator in response to said first signal when said first signal is of negative polarity, said second indicator thereby producing an indication that said second set of contacts is open; and a third detector network connected to receive said second voltage drop signal and adapted to activate a third indicator in response to said third signal when said third signal is of positive polarity, said third indicator thereby producing an indication that said third set of contacts is open.

11. The combination of claim 10 wherein said second detector network is connected to receive said second voltage drop signal and is adapted to activate said second indicator in response to said second signal when said second signal is of negative polarity, said second indicator thereby producing an indication that said second set of contacts is open.

12. In combination with a redundant overspeed protection system for a steam turbine wherein said overspeed protection system includes an actively closed two out of three redundant logic control network having first and second shunt current paths for diversion of a load current in the event of loss or redundancy, a monitor for indicating such loss, comprising:

first current sensing means disposed within said first shunt current path to produce a first shunt signal indicative of current flow in said first shunt current path, the polarity of said first shunt signal being indicative of shunt current flow direction;

second current sensing means disposed within said second shunt current path to produce a second shunt signal indicative of current flow in said second shunt current path, the polarity of said second shunt signal being indicative of shunt curent flow direction;

first detector means responsive to said first shunt signal whenever said first shunt signal is of positive polarity, said first detector means adapted to activate a first indicator uniquely designating a first one of said three channels to be out of serivce;

second detector means responsive to said first shunt signal whenever said first shunt signal is of negative polarity, said second detector means adapted to activate a second indicator uniquely designating a second one of said three channels to be out of service; and third detector means responsive to said second shunt signal whenever said second shunt signal is of positive polarity, said third detector means adapted to activate a third indicator uniquely designating a third one of said three channels to be out of service.

13. The combination of claim 12 wherein said second detector means is responsive to said second shunt signal whenever said second shunt signal is of negative polarity.

14. The combination of claim 12 wherein said first and second current sensing means are resistors of relatively low resistance so that shunt currents are substantially equal in magnitude to normal load current.

15. The combination of claim 14 wherein said first, second, and third detector means each comprise an amplifier responsive to produce an output signal, and a switching means adapted to activate the associated indicator in response to said output signal.

* * * * *